(12) United States Patent
Luechinger et al.

(10) Patent No.: US 8,573,468 B1
(45) Date of Patent: Nov. 5, 2013

(54) ULTRASONIC BONDING SYSTEMS AND METHODS OF USING THE SAME

(71) Applicant: Orthodyne Electronics Corporation, Irvine, CA (US)

(72) Inventors: Christoph B. Luechinger, Irvine, CA (US); Orlando L. Valentin, Rancho Santa Margarita, CA (US); Tao Xu, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 13/941,922

(22) Filed: Jul. 15, 2013

Related U.S. Application Data

(63) Continuation of application No. 13/578,740, filed as application No. PCT/US2011/034411 on Apr. 29, 2011.

(60) Provisional application No. 61/329,697, filed on Apr. 30, 2010.

(51) Int. Cl.
*B23K 20/10* (2006.01)
*B23K 31/02* (2006.01)

(52) U.S. Cl.
USPC ........ 228/110.1; 228/1.1; 228/4.5; 228/180.5

(58) Field of Classification Search
None
See application file for complete search history.

(56) References Cited

U.S. PATENT DOCUMENTS

| | | | |
|---|---|---|---|
| 2,985,954 A | 5/1961 | James et al. | |
| 3,840,169 A | 10/1974 | Steranko et al. | |
| 4,867,370 A | 9/1989 | Welter et al. | |
| 5,171,387 A | 12/1992 | Wuchinich | |
| 5,183,523 A | 2/1993 | Rinehart et al. | |
| 5,443,667 A | 8/1995 | Wood et al. | |
| 5,791,549 A | 8/1998 | Ito | |
| 5,839,640 A | 11/1998 | Kinnaird | |
| 5,885,409 A | 3/1999 | Gil | |
| 5,894,983 A | 4/1999 | Beck et al. | |
| 5,971,251 A | 10/1999 | Moore et al. | |
| 6,357,504 B1 | 3/2002 | Patel et al. | |
| 7,392,923 B2 | 7/2008 | Stroh et al. | |
| 7,533,791 B2 | 5/2009 | Steiner et al. | |
| 7,677,431 B2 | 3/2010 | Wong et al. | |
| 2002/0000459 A1 | 1/2002 | Wnek et al. | |
| 2002/0195478 A1 | 12/2002 | Yamano et al. | |
| 2003/0066863 A1 | 4/2003 | Skogsmo et al. | |
| 2004/0020580 A1 | 2/2004 | Oishi et al. | |

(Continued)

FOREIGN PATENT DOCUMENTS

| | | |
|---|---|---|
| JP | 10163276 | 6/1998 |
| JP | 10321654 | 12/1998 |

OTHER PUBLICATIONS

International Search Report dated Dec. 13, 2011; International Patent Application No. PCT/US2011/034411.

*Primary Examiner* — Kiley Stoner
(74) *Attorney, Agent, or Firm* — Christopher M. Spletzer, Sr.

(57) ABSTRACT

An ultrasonic bonding machine is provided. The ultrasonic bonding machine includes a support structure configured to support a workpiece during a bonding operation. The ultrasonic bonding machine further includes an upper bonding tool positioned above the support structure and configured for bonding an upper bonding material to an upper side of the workpiece, and a lower bonding tool positioned below the support structure and configured for bonding a lower bonding material to a lower side of the workpiece. The ultrasonic bonding machine may also be an ultrasonic ribbon bonding machine configured to bond an upper and lower conductive ribbon to a solar substrate.

68 Claims, 15 Drawing Sheets

(56) References Cited

U.S. PATENT DOCUMENTS

| | | |
|---|---|---|
| 2006/0208033 A1 | 9/2006 | Welter |
| 2006/0255091 A1 | 11/2006 | Reatherford et al. |
| 2007/0001320 A1 | 1/2007 | Maeda |
| 2007/0068991 A1 | 3/2007 | Handel et al. |
| 2008/0110574 A1 | 5/2008 | Etoh |
| 2009/0250171 A1 | 10/2009 | Wieduwilt et al. |

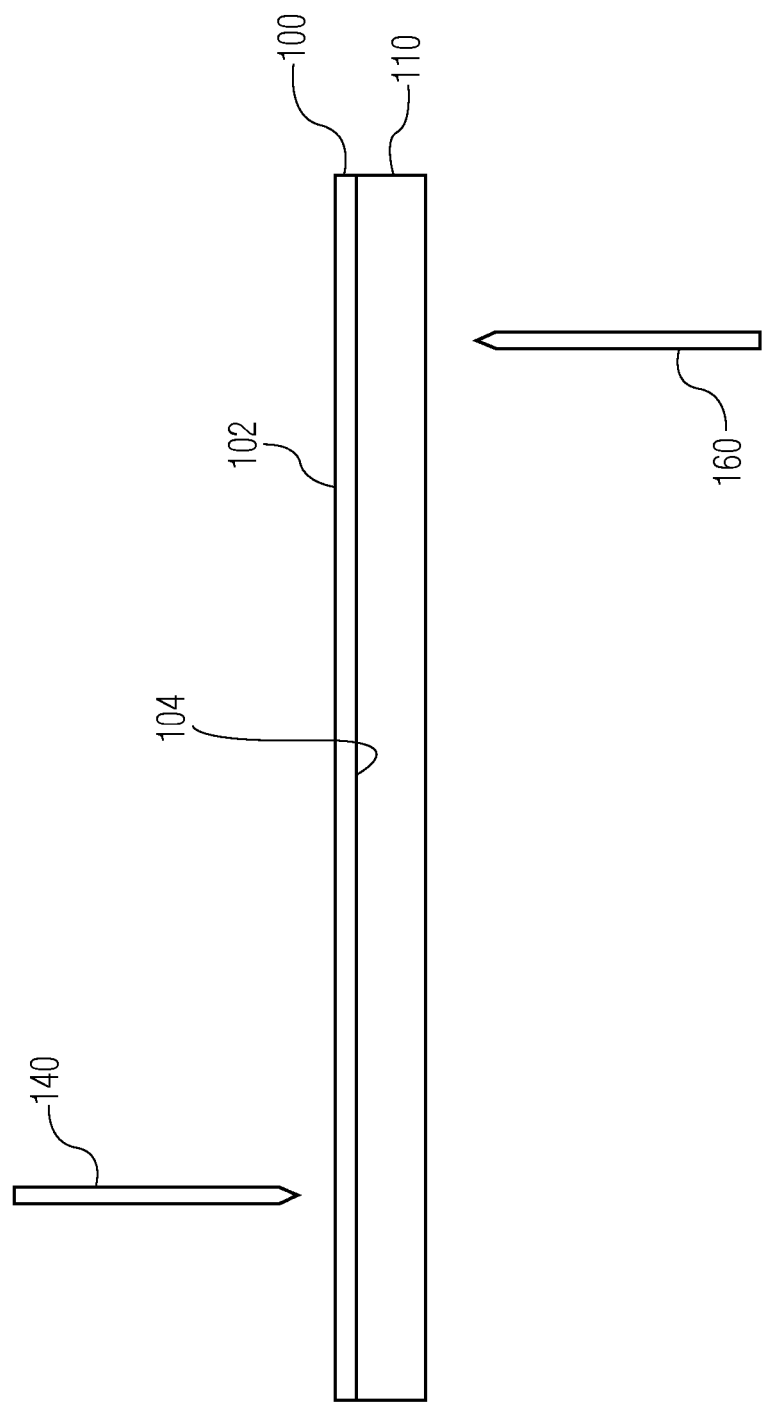

ULTRASONIC BONDING SYSTEMS AND METHODS OF USING THE SAME

CROSS-REFERENCE TO RELATED APPLICATIONS

This application is a continuation of U.S. patent application Ser. No. 13/578,740 filed on Aug. 13, 2012, which claims the benefit of International Patent Application No. PCT/US2011/034411 filed Apr. 29, 2011, which claims the benefit of U.S. Provisional Application No. 61/329,697 filed on Apr. 30, 2010, the content of all of which is incorporated herein by reference.

FIELD OF THE INVENTION

The present invention relates to ultrasonic bonding operations, and more particularly, to bonding systems for solar cells or the like.

BACKGROUND OF THE INVENTION

In the processing and packaging of semiconductor devices, ultrasonic bonding (e.g., wire bonding, ribbon bonding, etc.) continues to be a widely used method of providing electrical interconnection between locations within a package. For example, ribbon bonding machines are used to form ribbon interconnections between respective locations to be electrically interconnected such as is disclosed in U.S. Pat. No. 7,745,253, the contents of which are herein incorporated by reference in their entirety. In ultrasonic bonding, an upper terminal end of a bonding tool is typically engaged in an ultrasonic transducer which causes the bonding tool to vibrate during bonding. Ultrasonic bonding typically uses relative motion between (1) the bonding material and (2) a bonding location to form a bond therebetween. Ultrasonic wedge wire and ribbon bonding are typically low temperature (i.e., room temperature) bonding processes (although heat may be used if desired). In contrast, ultrasonic ball bonding often uses heat wherein the ultrasonic process may then be referred to as thermosonic.

In providing electrical interconnection in solar substrate applications (e.g., crystalline silicon solar cells, thin film solar cells, etc.) techniques such as soldering or conductive adhesive are used to electrically connect adjacent cells. Certain types of solar substrates (e.g., crystalline silicon solar cells) utilize such connections on the top and bottom of the substrate. Such soldering processes have limitations such as cost, reliability, yield, compliance with lead free requirements, and complexity.

Thus, it would be desirable to provide improved ultrasonic bonding systems and methods of use.

SUMMARY OF THE INVENTION

According to an exemplary embodiment of the present invention, an ultrasonic bonding machine is provided. The ultrasonic bonding machine includes a support structure configured to support a workpiece during a bonding operation. The ultrasonic bonding machine further includes an upper bonding tool positioned above the support structure and configured for bonding an upper bonding material to an upper side of the workpiece, and a lower bonding tool positioned below the support structure and configured for bonding a lower bonding material to a lower side of the workpiece.

According to another exemplary embodiment of the present invention, a method of bonding a workpiece is provided. The method includes the step of supporting a workpiece with a support structure during a bonding operation. The method further includes the steps of bonding an upper bonding material to an upper side of the workpiece using an upper bonding tool positioned above the workpiece, and bonding a lower bonding material to a lower side of the workpiece using a lower bonding tool positioned below the workpiece.

According to another exemplary embodiment of the present invention, an ultrasonic ribbon bonding machine is provided. The ultrasonic ribbon bonding machine includes a support structure configured to support a solar substrate during a ribbon bonding operation. The ultrasonic ribbon bonding machine further includes an upper ribbon bonding tool positioned above the support structure and configured for bonding a first conductive ribbon to an upper side of the solar substrate, and a lower ribbon bonding tool positioned below the support structure and configured for bonding a second conductive ribbon to a lower side of the solar substrate.

According to another exemplary embodiment of the present invention, a method of bonding a solar substrate is provided. The method includes the step of supporting a solar substrate with a support structure during a bonding operation. The method further includes the steps of bonding a first conductive ribbon to an upper side of the solar substrate using an upper ribbon bonding tool positioned above the solar substrate, and bonding a second conductive ribbon to a lower side of the solar substrate using a lower ribbon bonding tool positioned below the solar substrate.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 is a side sectional block diagram view of a substrate with respective bonding tools over an upper side and under a lower side in accordance with an exemplary embodiment of the present invention;

DETAILED DESCRIPTION OF THE INVENTION

Figure 2A:
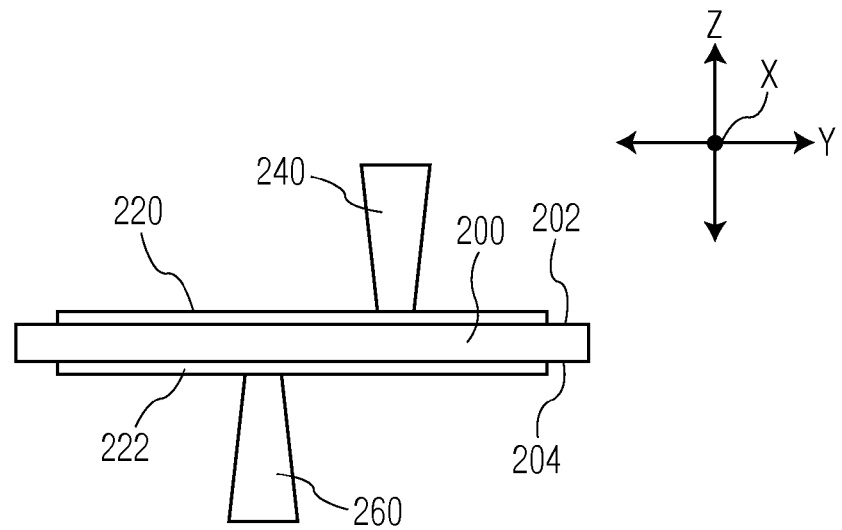
FIGS. 2A-2E are side sectional block diagram views of bonding tool positions and configurations according to various exemplary embodiments of the present invention.

According to various exemplary embodiments of the present invention, ultrasonic bonding systems (and related processes) are provided for bonding to an upper side and a lower side of a workpiece. More specifically, an upper bonding tool is provided for bonding a bonding material to an upper side of the workpiece, and a lower bonding tool is provided for bonding a bonding material to a lower side of the workpiece. Bonding operations of the upper and lower bonding tools may (or may not) be simultaneous. The workpiece may be any type of device configured for bonding on an upper side and a lower side. The ultrasonic bonding systems may be, for example: (1) ball bonding systems for forming wire interconnections and related structures (e.g., wire loops); (2) wedge wire bonding systems for forming wire interconnections and related structures (e.g., wire loops); and (3) ribbon bonding systems (e.g., wedge ribbon bonding systems) for forming ribbon interconnections using materials such as aluminum ribbon material, aluminum-copper clad ribbon material, amongst others.

An exemplary workpiece is a semiconductor device such as a semiconductor die (or a plurality of die) supported by a leadframe strip. One specific exemplary workpiece includes a leadframe strip with semiconductor die(s) attached on both an upper and lower side (e.g., power semiconductor devices such as MOSFETs). Another specific exemplary workpiece is a solar substrate (e.g., solar cell) such as a crystalline silicon solar cell. The present invention has specific advantages in solar substrate applications where it is desirable to form electrical interconnections on both an upper and a lower side of the workpiece. In embodiments of the present invention including a bonding tool(s) for bonding an upper side of the workpiece as well as a bonding tool(s) for bonding a lower side of the workpiece, the workpiece may not need to be flipped over to form the lower side bonds (e.g., ribbon bonds). This results in less handling of the workpiece (and therefore a lower cost of handling equipment), and a reduced potential for damage to the workpiece.

FIG. 1 illustrates a block diagram view of an exemplary ultrasonic bonding system including support structure 110 supporting workpiece 100. Workpiece 100 may be a substrate (e.g., a leadframe carrying one or more semiconductor die), a solar substrate (e.g., a solar cell), amongst others. Support structure 110 may be any appropriate structure for supporting the given workpiece such as, for example, a heat block, an anvil, a vacuum chuck, amongst others. Such a support structure may be included in an indexing system, similar to such systems used on die or wire bonding equipment. Upper bonding tool 140 is positioned above support structure 110/workpiece 100 and is configured to bond an upper bonding material (not shown) to upper side 102 of workpiece 100. Lower bonding tool 160 is positioned below support structure 110/workpiece 100 and is configured to bond a lower bonding material (not shown) to lower side 104 of workpiece 100 through openings (not shown) in the support structure. Upper and lower bonding tools 140, 160 may be, for example, ball bonding tools, wedge wire bonding tools, ribbon bonding tools, etc. As will be appreciated by those skilled in the art, upper and lower bonding tools 140, 160 may be used in conjunction with other elements of an ultrasonic bonding system that are not shown for simplicity (e.g., an ultrasonic transducer, a bond head assembly, a wire feed system, a vision system, a material handling system, a pressing member, amongst others). The upper and lower bonding materials may be, for example, conductive wires, conductive ribbons, etc.

FIGS. 2A-2E illustrate the positions and configurations of upper and lower ultrasonic bonding tools 240, 260 when bonding respective upper and lower bonding materials 220, 222 to upper and lower surfaces 202, 204 of workpiece 200 in accordance with various exemplary embodiments of the present invention.

FIG. 2A illustrates upper bonding tool 240 (for bonding upper bonding material 220 to upper surface 202 of workpiece 200) and lower bonding tool 260 (for bonding lower bonding material 222 to lower surface 204 of workpiece). Tools 240 and 260 are spaced apart from one another in a horizontal plane (e.g., the XY plane in accordance with the legend). If desired, the bonding sequences may be configured such that the respective tools 240, 260 never bond directly above one another simultaneously. Other elements not shown in FIG. 2A may include pressing elements above/below the respective tools 240, 260 for support before, during, and/or after bonding. Depending upon the configuration such pressing elements may be omitted.

Figure 2B:
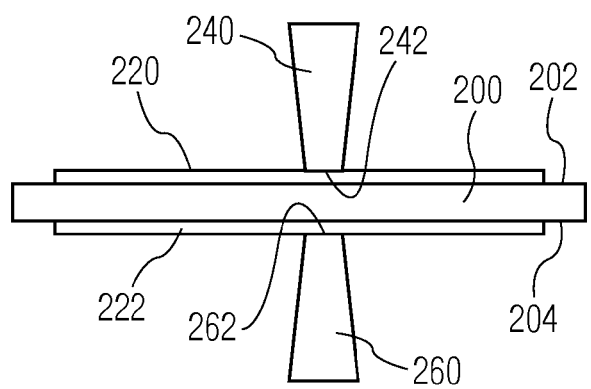

FIG. 2B illustrates upper bonding tool 240 (for bonding upper bonding material 220 to upper side 202 of workpiece 200) opposing lower bonding tool 260 (for bonding lower bonding material 222 to lower side 204 of workpiece 200). For example, face 242 of upper bonding tool 240 is substantially directly above face 262 of lower bonding tool 260. In this arrangement, upper bonding tool 240 may be used for support during bonding using lower bonding tool 260, and lower bonding tool 260 may be used for support during bonding using upper bonding tool 240. In an example ribbon bonding application using a ribbon bonding tool having a rectangular face, the tools may be aligned/rotated to at any desired angle (e.g., zero degrees, 90 degrees, etc.) with respect to one another.

Figure 2C:
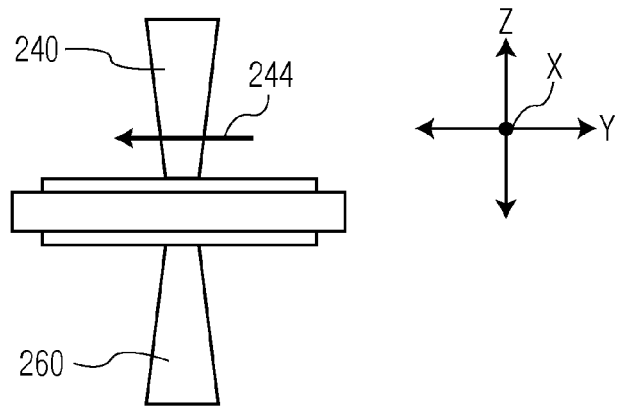
Figure 2D:
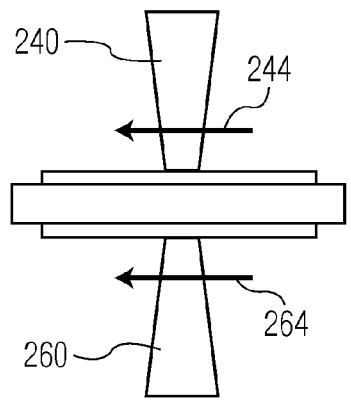
Figure 2E:
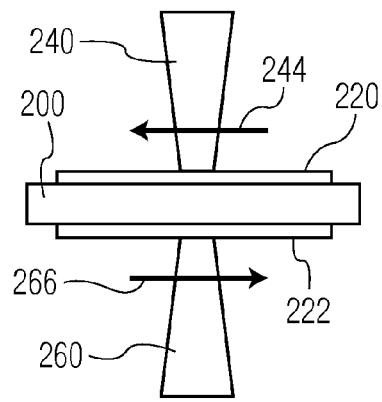

FIGS. 2C-2E illustrate exemplary configurations of upper and lower bonding tools 240, 260 during a bonding operation and illustrate mutual support between upper and lower bonding tools 240, 260 during respective upper and lower bond formation. FIG. 2C illustrates sequential such upper and lower bond formation, FIG. 2D illustrates simultaneous, in-phase upper and lower bond formation, and FIG. 2E illustrates simultaneous, out-of-phase upper and lower bond formation.

"In-phase" as used herein refers to vibration of the upper and lower bonding tools together in the same direction, that is, they vibrate/scrub in the same direction at substantially the same time, that is, substantially synchronized with one another (e.g., the tools remain substantially one over the other during bonding as illustrated in FIG. 2D). "Out-of-phase" as used herein refers to vibration of the bonding tools that are not in-phase, and may include vibration/scrub in substantially opposite directions with respect to one another, that is, substantially asynchronous vibration. That is, when an upper bonding tool is moving to the right, the lower bonding tool is moving to the left and vice versa.

FIG. 2C illustrates lower bonding tool 260 providing support during bonding by upper bonding tool 240. Upper bonding tool 240 vibrates as at 244 (e.g., induced by connection to an upper transducer of an upper ultrasonic bond head assembly, not shown) to form an upper bond, while lower bonding tool 260 which provides support for the upper bond formation may (or may not, as desired) remain substantially static). Once the upper bond is formed, upper bonding tool 240 may cease vibration and remain substantially static to support formation of a lower bond by vibrating lower bonding tool 260 (e.g., induced to vibrate through a connection to a lower transducer of lower ultrasonic bond head assembly, not shown). It is noted that this sequence of upper and lower bond formation may be reversed. Of course, more than one upper bond may be formed using the upper bonding tool 240 (using the lower bonding tool 260 as a support) before switching to formation of lower bonds using the lower bonding tool 260 (using the upper bonding tool 240 as a support).

FIG. 2D illustrates substantially simultaneous, in-phase upper and lower bond formation by opposing upper and lower bonding tools 240, 260. Upper bonding tool 240 vibrates as at 244 to form the upper bond, while lower bonding tool 260 vibrates as at 264 to form the lower bond, such that upper bonding tool 240 and lower bonding tool 260 vibrate in-phase. This in-phase vibration is shown schematically by upper and lower bonding tool arrows 244, 264 pointing in the same direction (to the left as illustrated). With such in-phase vibration of upper and lower bonding tools 240, 260, bonding tools 240, 260 may (or may not) be supported by a common transducer/bond head assembly (not shown).

FIG. 2E illustrates substantially simultaneous, out-of-phase upper and lower bond formation by opposing upper and lower bonding tools 240, 260. Upper bonding tool 240 vibrates as at 244 to form the upper bond, while lower bonding tool 260 vibrates as at 266 to form the lower bond, such that upper bonding tool 240 and lower bonding tool 260 vibrate out-of-phase. This out-of-phase vibration (e.g., 180 degrees out of phase with one another) is shown schematically by upper bonding head arrow 244 pointing in the left direction and lower bonding head arrow 266 pointing in the right direction. Such out-of-phase vibration of the opposing upper and lower bonding tools 240, 260 may assist in better bond formation because the relative motion between bonding tools may dampen or reduce movement of workpiece 200 that may have been induced by upper and lower bonding tools 240, 260, thereby increasing or maximizing relative motion between the bonding tools and the workpiece.

It is noted that in the following exemplary embodiments illustrated in FIGS. 3 and 4A-4C, certain portions of lower structures/elements (such as a portions of a lower bonding tool transducer) are generally shown in dashed lines to indicate that they are masked by a workpiece or the like.

Figure 3:
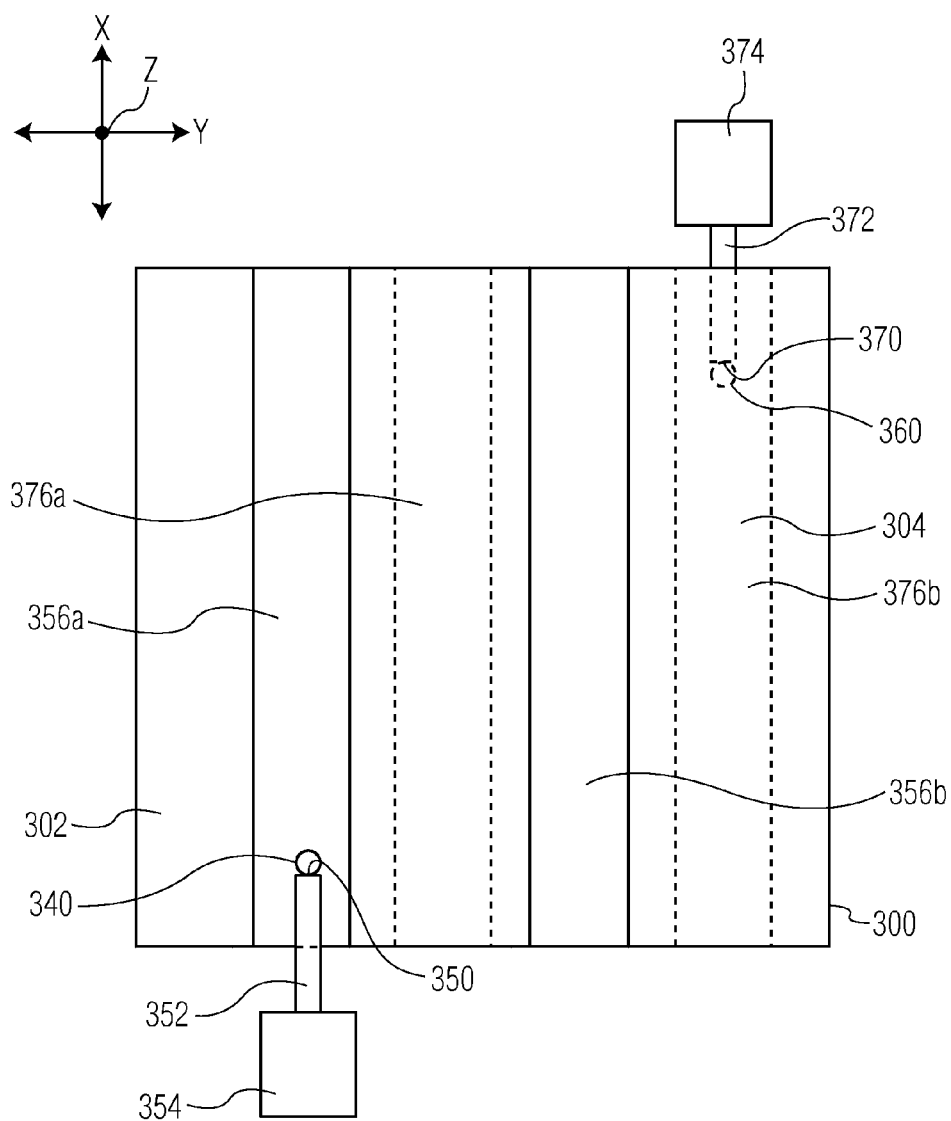
FIG. 3 is a plan block diagram view of a substrate during bonding with upper and lower bonding tools according to an exemplary embodiment of the present invention.

FIG. 3 illustrates bonding of workpiece 300 using upper and lower bonding tools 340, 360 spaced apart from one another in a horizontal plane (e.g., the XY plane as shown by the legend). Upper terminal end 350 of upper bonding tool 340 is engaged in upper transducer 352, and upper transducer 352 is supported by upper bond head assembly 354 of an upper bonding system. Lower terminal end 370 of lower bonding tool 360 is engaged in lower transducer 372, and lower transducer 372 is supported by lower bond head assembly 374 of an upper bonding system.

As illustrated, upper bonding tool 340 and lower bonding tool 360 may bond both upper side 302 and lower side 304, respectively, of workpiece 300 during a bonding operation. Upper bonding tool 340 is configured to bond a bonding material (e.g., a wire, a conductive ribbon, etc., not shown) to conductive regions 356a, 356b (e.g., busbars 356a, 356b) of upper side 302 of workpiece 300. Lower bonding tool 360 is configured to bond a bonding material to conductive regions 376a, 376b of lower side 304 of workpiece 300. Upper and lower conductive regions of a given workpiece may be staggered (as shown in FIG. 3), or may oppose each other. Further, in certain applications, the entire lower surface of the workpiece may be conductive while the upper surface may include conductive regions (e.g., busbars on an upper surface of a solar substrate), or vice-versa.

Figure 4A:
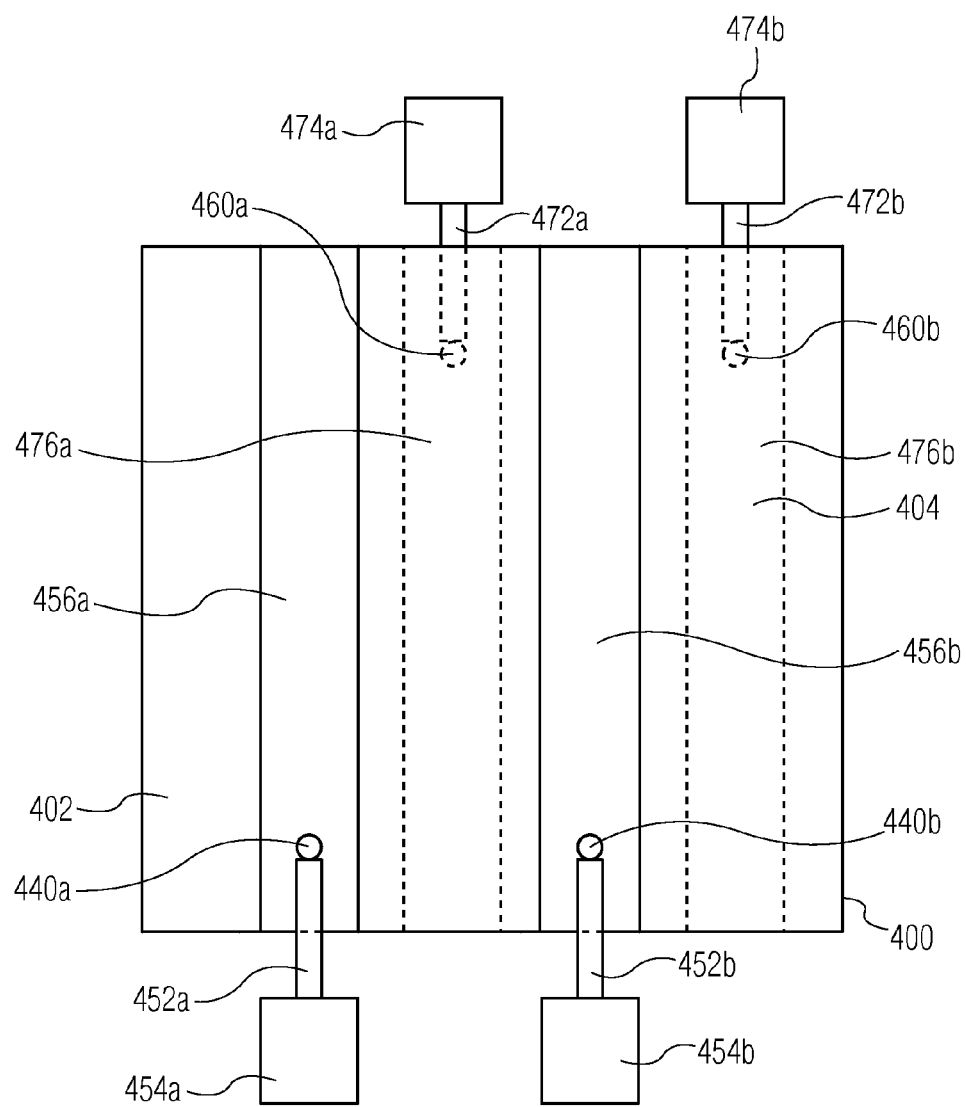
FIG. 4A is a plan block diagram view of a substrate during bonding with multiple upper and lower bonding tools according to an exemplary embodiment of the present invention.
Figure 4B:
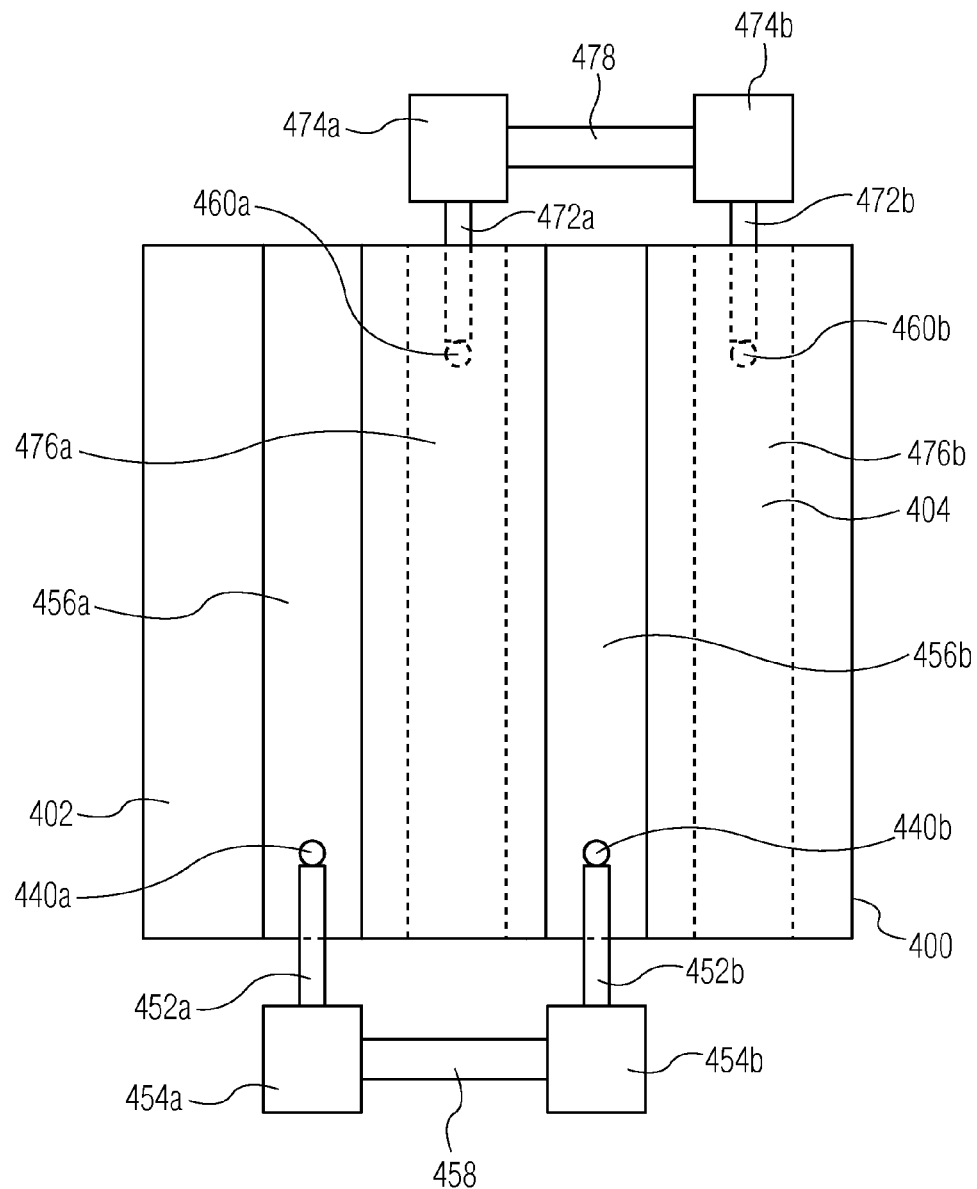
FIGS. 4B-4C are plan block diagram views of a substrate during bonding with respective upper bonding tools carried together, and lower bonding tools coupled for movement together, according to exemplary embodiments of the present invention.

FIGS. 4A-4B illustrate workpiece 400 being bonded with multiple upper and lower bonding tools according to certain exemplary embodiments of the present invention. FIG. 4A illustrates two upper bonding tools 440a, 440b with their respective upper terminal ends engaged in transducers 452a, 452b, where upper transducers 452a, 452b are supported by respective upper bond head assemblies 454a, 454b of an upper bonding system(s). The lower terminal ends of respective lower bonding tools 460a, 460b are engaged in lower transducers 472a, 472b, where lower transducers 472a, 472b are supported by respective lower bond head assemblies 474a, 474b of a lower bonding system(s). Upper bonding tools 440a, 440b are configured to bond upper bonding materials to respective conductive regions 456a, 456b of upper side 402 of workpiece 400. Lower bonding tools 460a, 460b are configured to bond lower bonding materials to respective conductive regions 476a, 476b of lower side 404 of workpiece 400. Each set of bonding tools 440a, 440b; 460a, 460b may act in concert, or either or both sets may act independently during the bonding processes.

While it is contemplated that there may be more than two multiple bonding tools on each side of workpiece 400, there may also be multiple bonding tools on one side of workpiece 400, and only one bonding tool on the other side of workpiece 400, and there may also be unequal numbers of multiple bonding tools on either sides of workpiece 400. Of course, it is understood that the use of multiple bonding tools on the upper and/or lower sides of the workpiece may reduce bonding time of the workpiece, and may simplify certain aspects of the design of the bonding system.

FIG. 4B illustrates another bonding system similar to that shown in FIG. 4A (with the same numbering of elements except as specified). In FIG. 4B: (1) upper bonding tools 440a, 440b are carried by upper bond head assemblies 454a, 454b, respectively, which are physically connected to one another by coupling structure 458; and (2) the lower bonding tools 460a, 460b are carried by lower bond head assemblies 474a, 474b, respectively, which are physically connected to one another by coupling structure 478. Thus, each pair of bond head assemblies/bonding tools is coupled for movement together in at least one direction. Of course, more than two bonding tools (e.g., including bond head assemblies) may be connected together as desired in the given application. Further, bonding tool pairs 440a, 440b; 460a, 460b may be carried by a common structure that is different than coupling structures 458, 478 (e.g., a coupling structure different from one that connects respective bond head assemblies, etc.).

It is understood that certain workpieces (e.g., solar substrates/cells) may include bonding locations with a predetermined spacing. For example, FIG. 7A (described below) illustrates workpiece 700 (e.g., solar substrate 700) including two bonding locations (e.g., busbars 782) on upper surface 702, where busbars 782 have a predetermined spacing between each other. It is desired to bond a bonding material (e.g., a ribbon material) to each of bonding locations 782, and as such, it may be desirable to provide a bonding system that includes multiple bonding tools configured to bond the bonding material to the bonding location simultaneously. In one example, the number of bonding tools may equal the number of bonding locations (e.g., busbars of a solar substrate) to be bonded.

These multiple bonding tools may be independently moveable with respect to one another (e.g., as in FIG. 4A) or may be carried together for movement in at least one direction (e.g., as in FIG. 4B). In a case where the multiple bonding tools are carried together, the spacing of the bonding tools may be provided to match the spacing of the conductive regions (e.g., busbars on a solar substrate). For example, the spacing between the bonding tools may be configured to equal the spacing between busbars 782 (e.g., see FIG. 7A). In such an example, the bonding tools (e.g., driven by a single bond head, driven by multiple bond heads, etc.) may move to a first XY location using an XY table of the bonding machine where a first XY location corresponds to an XY position of the desired bonded locations. Then, the upper bonding tools may be lowered (and/or the lower bonding tools may be raised) (e.g., along the Z-axis) until each of the bonding tools contacts a respective bonding material (e.g., the ribbon material). The bonding tools bond the bonding material to the respective bonding locations (e.g., bond a portion of ribbon material to a respective area of a busbar). Then, the upper bonding tools may be raised (and/or the lower bonding tools may be lowered) and moved to another XY location for forming another bonded portion along the length of the ribbon materials (e.g., forming another bonded portion along the length of the ribbon material to the corresponding busbar (e.g., see FIGS. 4D-4E, discussed below)). Such a process may be repeated until the desired number of bonded portions are formed between a given length of bonding material (e.g., a ribbon material) and a respective bonding location (e.g., a busbar of a solar substrate).

Figure 4C:
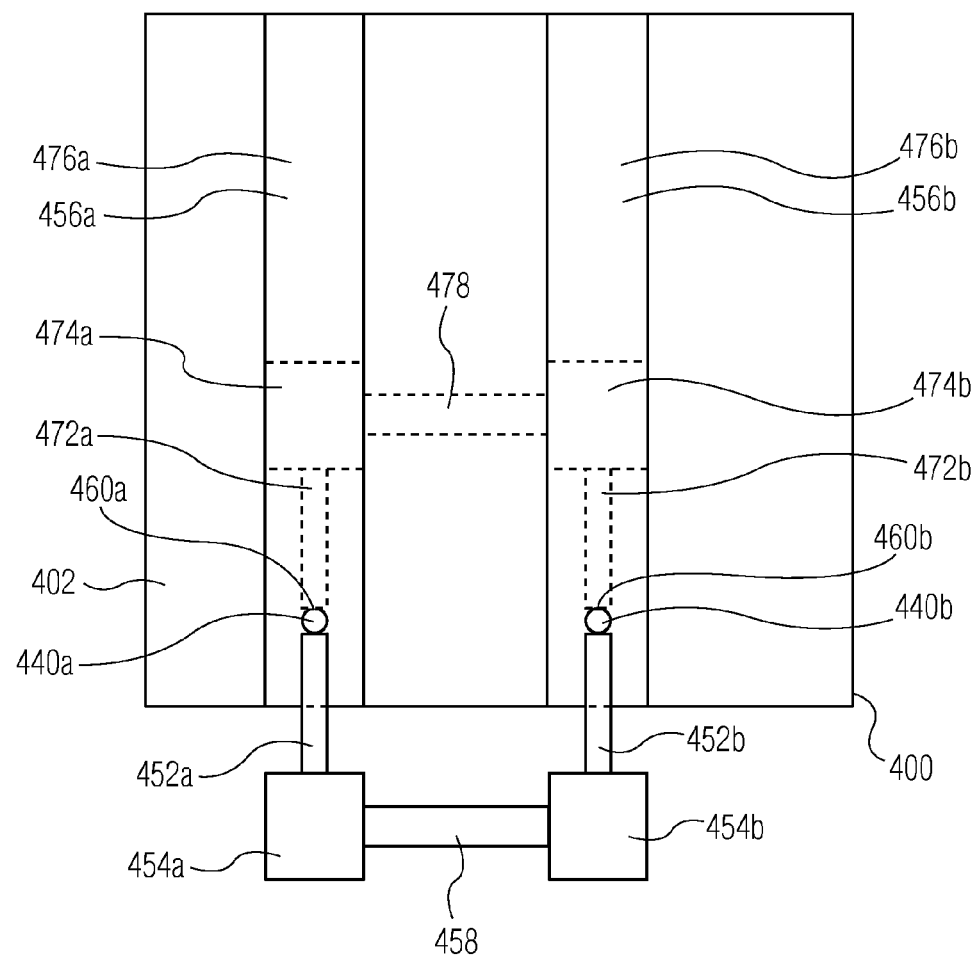

FIG. 4C illustrates another bonding system similar to that shown in FIG. 4B (with the same numbering of elements except as specified) except that in FIG. 4C, lower bonding locations 476a, 476b oppose (or are substantially under) respective upper bonding locations 456a, 456b. In such an exemplary embodiment, respective upper and lower bonding tools 440a, 440b; 460a, 460b may provide support for each other during their respective bond formation processes (e.g., see FIGS. 2B-2E), if desired.

Figure 4D:
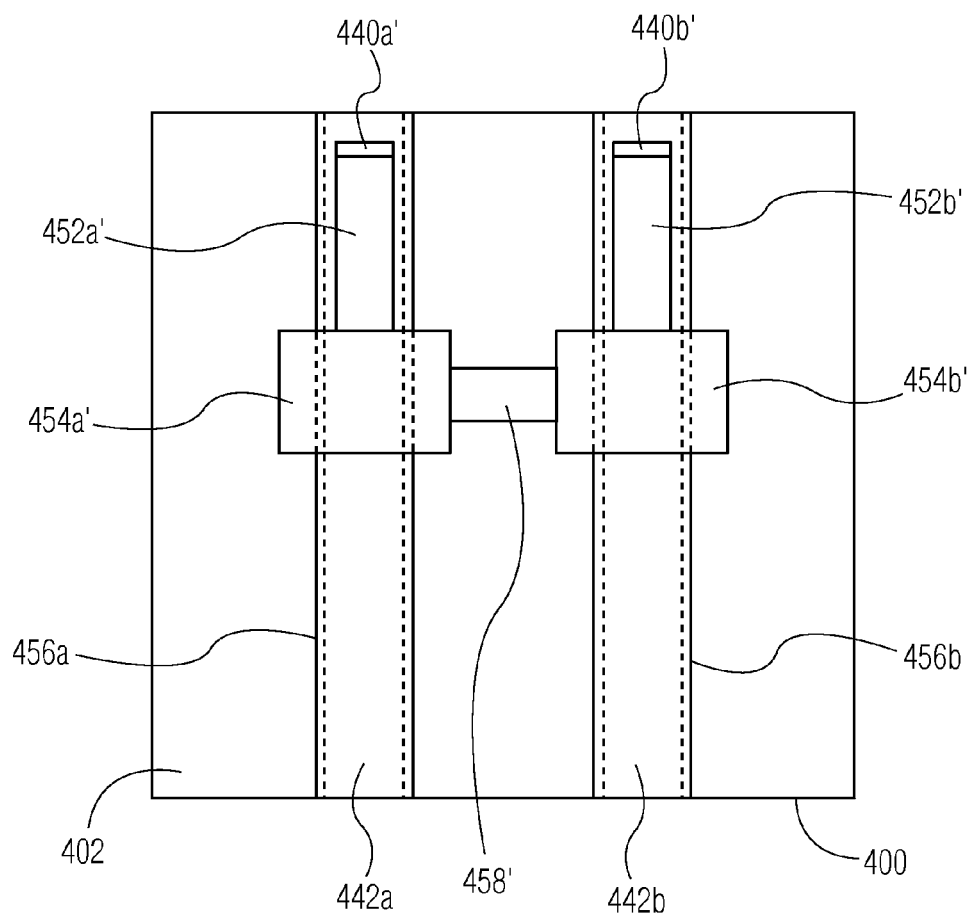
FIGS. 4D-4E are plan block diagram views of a substrate during bonding with upper bonding tools carried together, with FIG. 4E showing formed bonds, according to an exemplary embodiment of the present invention.
Figure 4E:
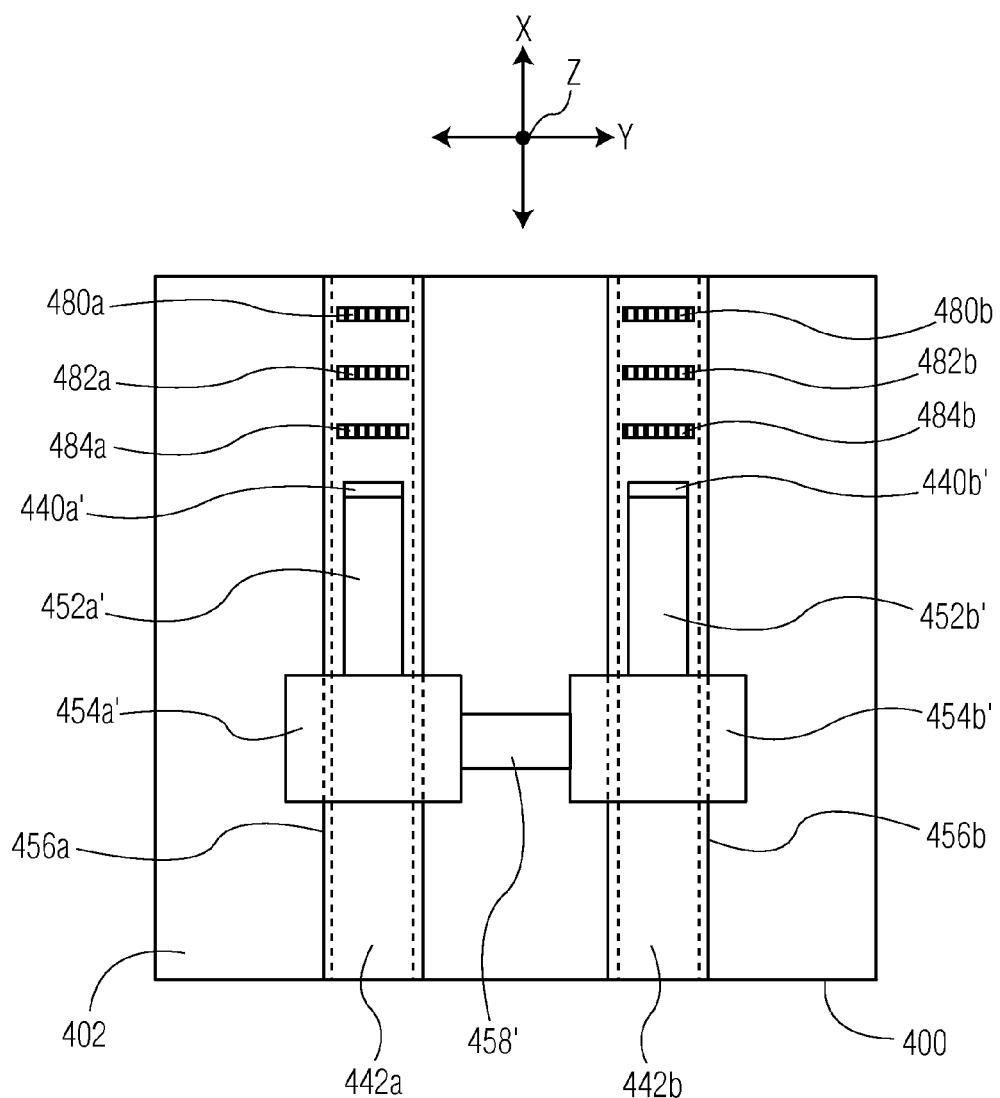

FIGS. 4D-4E illustrate a pair of bonding tools forming ribbon bonds on upper bonding locations (e.g., busbars) of a workpiece (e.g., a solar substrate) in accordance with an exemplary embodiment of the present invention. The formation of lower bonds on the lower surface of the workpiece is not illustrated for simplicity and ease of understanding. FIG. 4D illustrates workpiece 400 (e.g., solar substrate 400) having a pair of busbars 456a, 456b on its upper surface 402. A pair of conductive ribbons 442a, 442b is positioned on respective busbars 456a, 456b and is generally aligned therewith. Ribbon bonding tools 440a', 440b' have their respective upper terminal ends engaged in transducers 452a', 452b', and transducers 452a', 452b' are supported by respective upper bond head assemblies 454a', 454b'. Ribbon bonding tools 440a', 440b' are carried by bond head assemblies 454a', 454b', respectively, that are connected to one another by coupling structure 458'. Ribbon bonding tools 440a', 440b' are positioned on conductive ribbons 442a, 442b at respective first bonding locations and vibrate from the inducement of respective transducers 452a', 452b' to form ribbon bonds.

FIG. 4E illustrates the ribbon bonding system of FIG. 4D (with the same numbering of elements except as specified) during formation of ribbon bonds (between ribbons 442a, 442b and underlying busbars 456a, 456b). Three ribbon bond pairs 480a, 480b; 482a, 482b; 484a, 484b are illustrated. The vibration of ribbon bonding tools 440a', 440b' scrub against respective ribbons 442a, 442b to form ribbon bond pairs 480a, 480b; 482a, 482b; 484a, 484b. Bonding tools 440a', 440b' (carried together) may continue downwardly in FIG. 4E forming additional ribbon bonds at the spaced intervals as shown to securely bond respective ribbons 442a, 442b to busbars 456a, 456b on workpiece 400 (e.g., solar substrate 400). Ribbon bonding tools 440a', 440b' would typically scrub along the length of ribbons 442a, 442b (i.e., in the X-axis direction in FIG. 4E). However, bonding tools (in any of the exemplary embodiments illustrated and described herein) may scrub in any direction in accordance with the present invention.

Figure 4F:
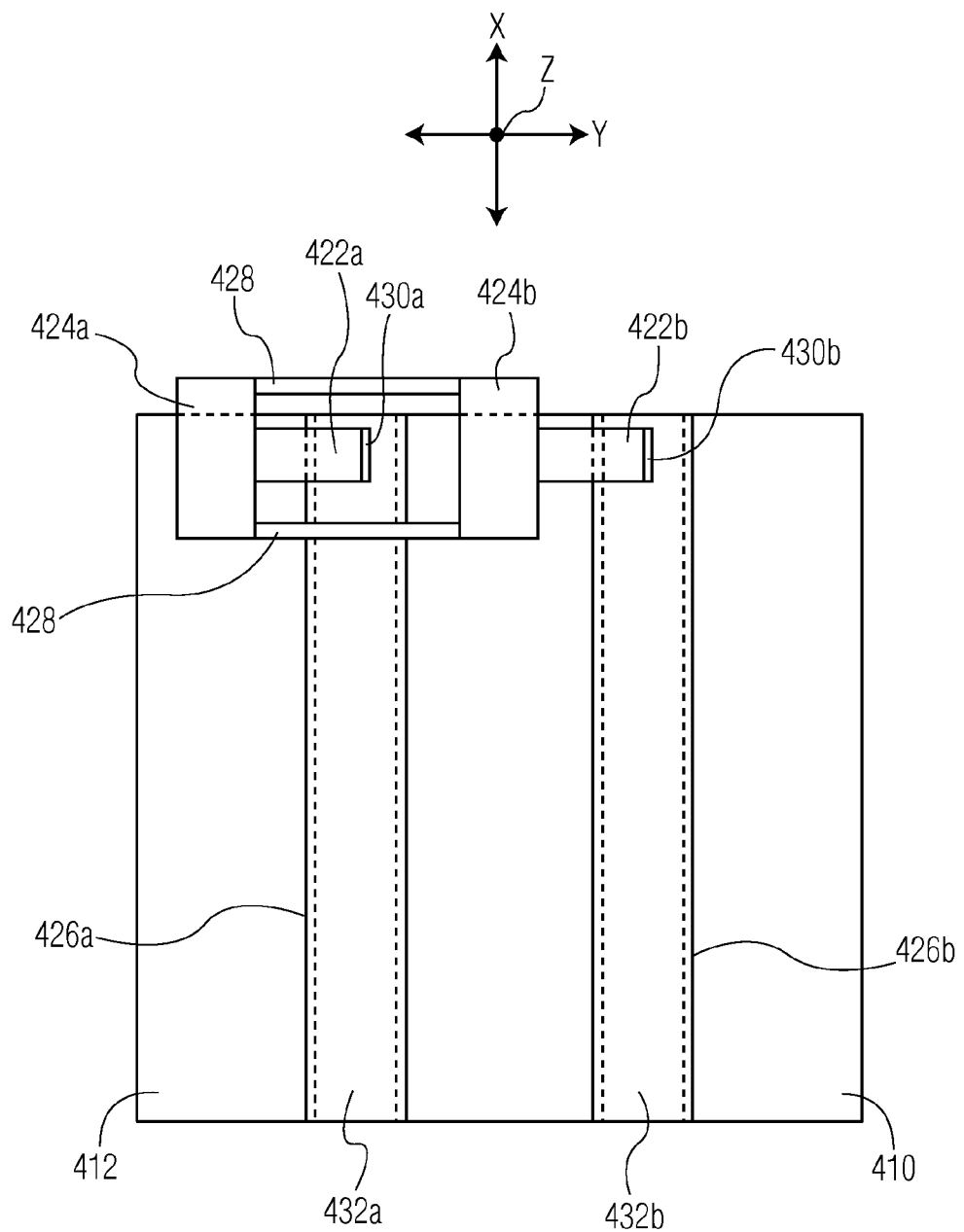
FIGS. 4F-4G are plan block diagram views of a substrate during bonding with upper bonding tools carried together, with FIG. 4G showing formed bonds, according to an exemplary embodiment of the present invention.
Figure 4G:
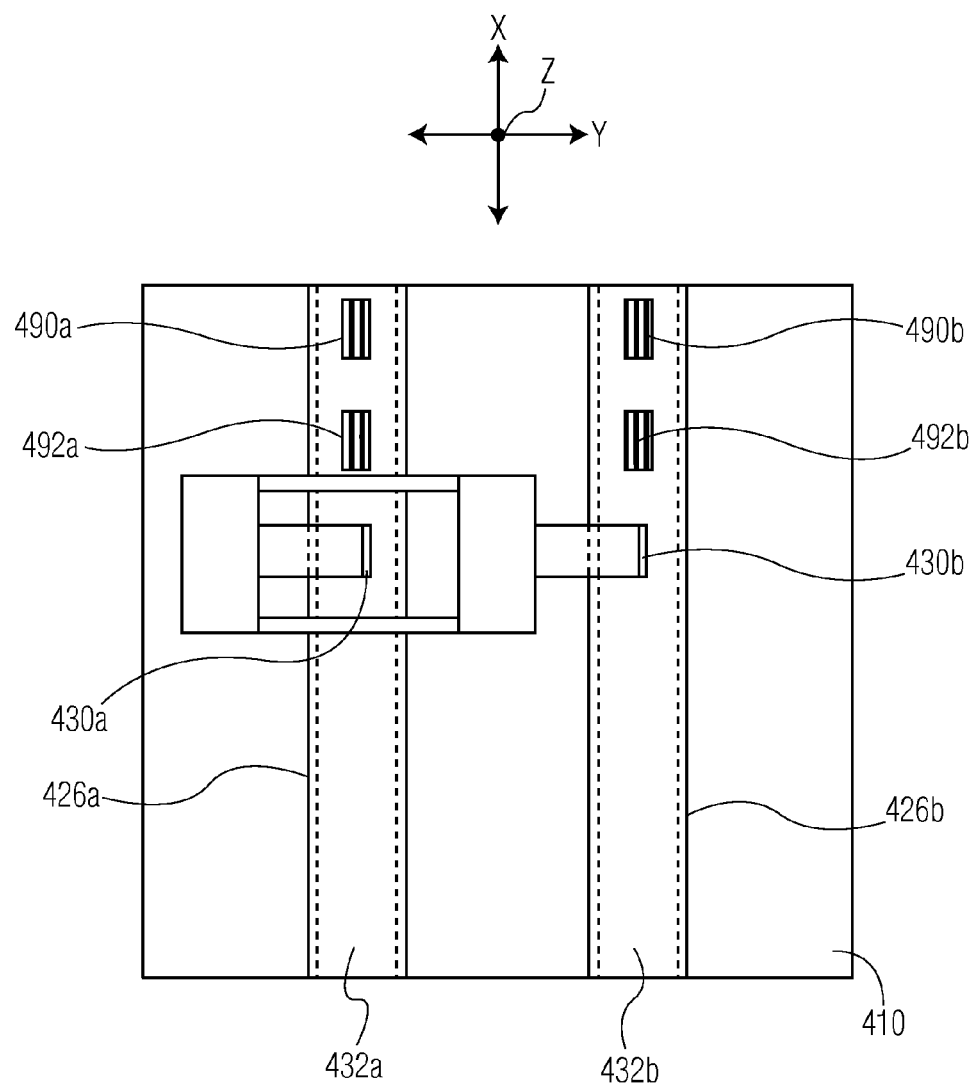

FIGS. 4F-4G illustrate a pair of bonding tools (carried together) in tandem forming ribbon bonds on upper bonding locations (e.g., busbars) of a workpiece (e.g., a solar substrate) in accordance with an exemplary embodiment of the present invention (with the same numbering of elements except as specified). In contrast to the embodiment illustrated in FIGS. 4D-4E, bonding tools 430a, 430b are configured to scrub/vibrate in a direction substantially perpendicular to the length of the ribbons 432a, 432b (i.e., along the Y-axis direction in FIGS. 4F-4G).

Specifically, FIG. 4F illustrates ribbon bonding tools 430a, 430b one behind the other (i.e., in line with one another) coupled together using coupling structures 428. Tools 430a, 430b form ribbon bonds (see FIG. 4G) on busbars 426a, 426b of upper side 412 of solar substrate 410 (the formation of bonds on the lower surface of solar substrate 410 is not shown for simplicity). Ribbons 432a, 432b are positioned on, and aligned with, respective busbars 426a, 426b. Bonding tools 430a, 430b (positioned over conductive ribbons 432a, 432b) have their respective upper terminal ends engaged in transducers 422a, 422b which are in turn supported by respective upper bond head assemblies 424a, 424b. Transducers 422a, 422b induce bonding tools 430a, 430b to vibrate in the Y-axis direction to form ribbon bonds.

FIG. 4G illustrates the ribbon bonding system of FIG. 4F during formation of exemplary ribbon bonds, that is, two ribbon bond pairs 490a, 490b; 492a, 492b as illustrated. Ribbon bonding tools 430a, 430b scrub against ribbons 432a, 432b to form the ribbon bond pairs. Coupled bonding tools 430a, 430b may continue to move downwardly in FIG. 4G (along the X-axis) forming additional ribbon bonds at the spaced intervals as shown to securely bond respective ribbons 432a, 432b to busbars 426a, 426b on solar substrate 410. While a pair of coupled bonding tools 430a, 430b are illustrated in FIG. 4G, alternative configurations are contemplated (e.g., a single bonding tool scrubbing along the Y-axis, more than two bonding tools carried together, multiple bonding tools carried together using alternative structural configurations). Of course, the bonding tools may operate (e.g., applying ultrasonic energy, applying bond force, etc.) together or independently. Other examples of such alternative structural configurations for carrying multiple bonding tools (and multiple transducers) include: (1) an arrangement where the coupling mechanism for carrying the transducers (and bonding tools) is positioned between the transducers such that the transducers point away from one another; and (2) an arrangement where a coupling mechanism for carrying the transducers (and bonding tools) is positioned such that they face one another.

Figure 5:
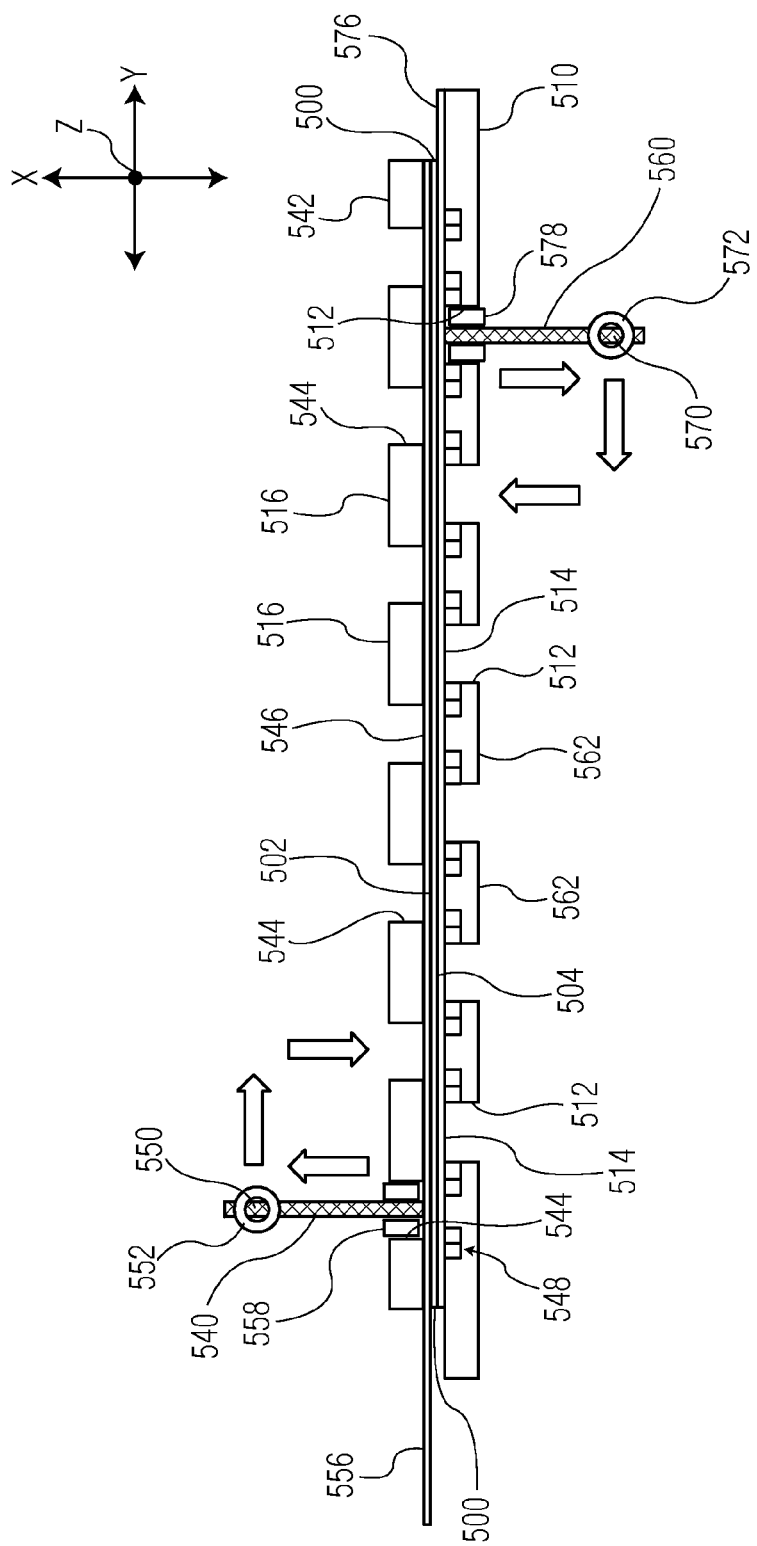
FIG. 5 is a side sectional block diagram view of a substrate bonding system having upper and lower apertured substrate pressing elements in accordance with an exemplary embodiment of the present invention.

FIG. 5 illustrates a side sectional block diagram view of a substrate bonding system having upper and lower apertured substrate pressing elements in accordance with an exemplary embodiment of the present invention. Upper bonding material 556 is bonded to upper side 502 of workpiece 500, and lower bonding material 576 is bonded to lower side 504 of workpiece 500. Support structure 510 (e.g., workholder 510) supports workpiece 500 (e.g., solar substrate 500), and defines a plurality of lower apertures 512 (separated by a plurality of lower pressing elements 562 defined by support structure 510). Apertures 512 expose lower portions 514 of lower bonding material 576. A plurality of vacuum ports 548 within support structure 510, and adjacent lower bonding material 576, may create a downward vacuum pull against lower bonding material 576 (and/or lower side 504 of workpiece 500) to retain substrate 500 against support structure 510. Lower bonding tool pressing member 578 (illustrated adjacent lower bonding tool 560 within aperture 512) is supported by the lower bond head assembly (not shown) and may be moveable with respect to the lower bond head assembly independent of lower bonding tool 560. Pressing member 578 presses against lower bonding material 576 proximate lower bonding tool 560 during removal of bonding tool 560 from material 576 (e.g., after a bonding operation), thereby reducing the potential for lower bonding tool 560 to peel away or otherwise damage lower bonding material 576 and/or a portion of workpiece 500 after bonding, because of tool 560 sticking to bonding material 576. Lower terminal end 570 of lower bonding tool 560 is engaged in lower transducer 572 which induces lower bonding tool 560 to vibrate during a bonding process.

Upper pressing member 542 (e.g., a clamping member for securing workpiece 500 against support structure 510) overlies upper bonding material 556, and includes a plurality of upper apertures 544 (separated by a plurality of upper pressing elements 516 defined by upper pressing member 542). Apertures 544 expose upper portions 546 of upper bonding material 556. Upper bonding tool pressing member 558 (illustrated adjacent upper bonding tool 540 within aperture 544) is supported by the upper bond head assembly (not shown) and is moveable with respect to the upper bond head assembly independent of upper bonding tool 540. Such a pressing member(s) may also be supported by (or integrated with), for example, a workholder of the bonding system. Pressing member 558 presses against upper bonding material 556 proximate upper bonding tool 540 during removal of bonding tool 540 from material 556 (e.g., after a bonding operation), thereby reducing the potential for upper bonding tool 540 to peel away or otherwise damage upper bonding material 556 and/or a portion of workpiece 500 after bonding, because of tool 540 sticking to bonding material 556. Upper terminal end 550 of upper bonding tool 540 is engaged in upper transducer 552 which induces upper bonding tool 540 to vibrate during a bonding process. Upper and lower bonding tools 540, 560 may form bonds within respective upper and lower apertures 544, 512 and may then move to another (adjacent) aperture 544, 512 as indicated by the respective sets of three arrows, and form bonds within those apertures, etc. As illustrated, a plurality of upper pressing elements 516 oppose lower apertures 512 and may serve to support lower bonding tool 560 while bonding in a plurality of lower apertures 512. Similarly, a plurality of lower pressing elements 562 oppose upper apertures 544 and may serve to support upper bonding tool 540 while bonding in a plurality of upper apertures 544.

As will be appreciated by those skilled in the art, workpiece 500 may be indexed and aligned into its proper location shown in FIG. 5 using any of a number of alignment structures such as, for example, locating pins, gripper mechanisms, pusher mechanisms, puller mechanisms. As shown in FIG. 5 (and applicable to other embodiments of the present invention, as desired) respective bonding materials (556, 576) have been provided on opposing sides of workpiece 500 prior to securing (between support structure 510 and upper pressing member 542) and subsequent bonding. The presence of the bonding materials (e.g., ribbon materials) on opposing sides of workpiece 500 prior to and during bonding substantially reduces the potential for damage to delicate structures of workpiece 500 because the bonding materials act as buffers between workpiece 500 and support structure 510 and upper pressing member 542. Bonding materials 556, 576 may be fed into their position on either side of workpiece 500 (e.g., prior to being secured in position) using any of a number of techniques, including, for example, manual placement, spool feeding, amongst others.

Figure 6A:
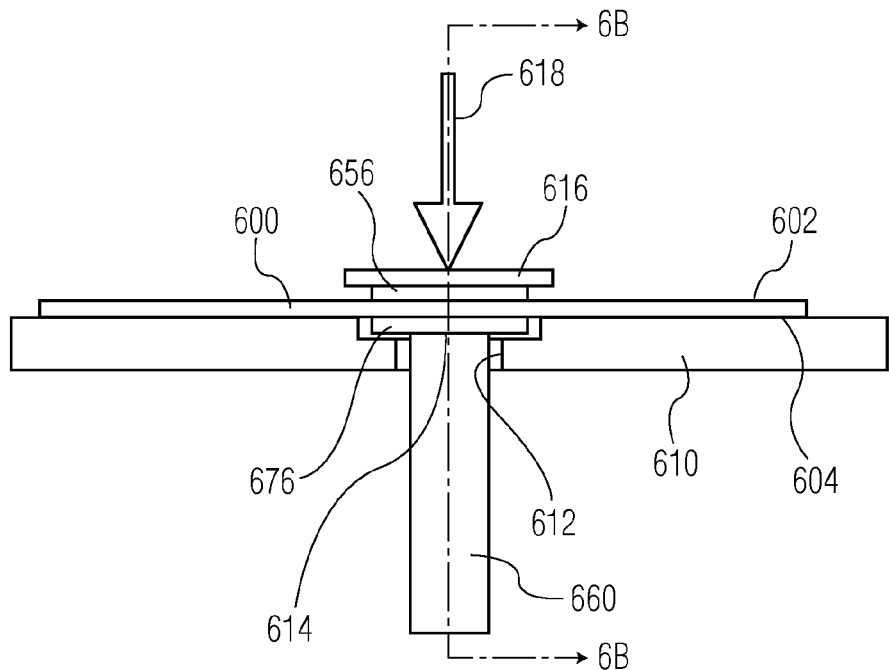
FIGS. 6A-6B are respective end and side sectional block diagram views of bonding system elements according to an exemplary embodiment of the present invention.
Figure 6B:
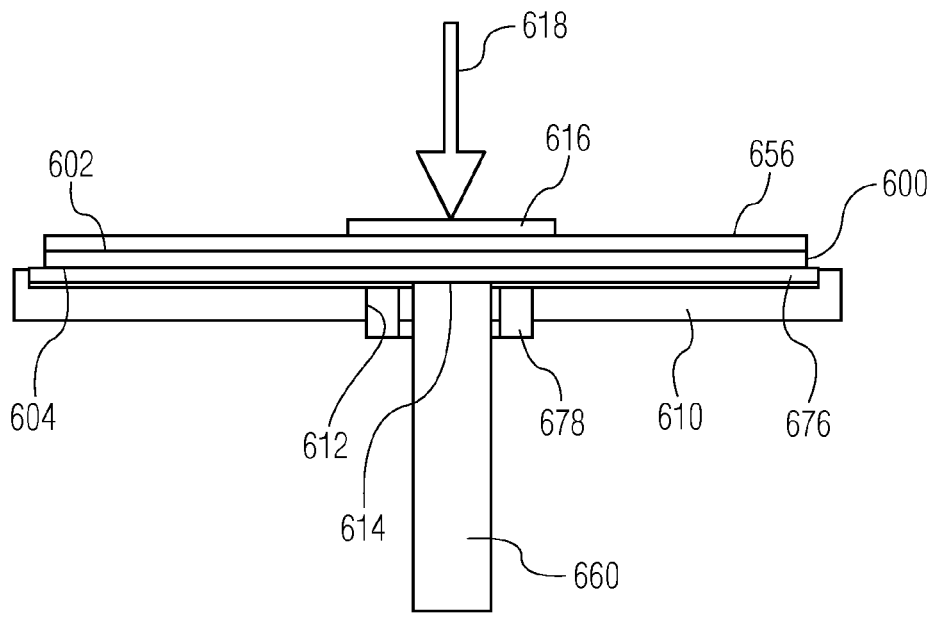

FIGS. 6A-6B illustrate respective end and side sectional block diagram views of a lower bonding tool forming a bond opposed by an upper workpiece pressing element to provide support for the lower bonding tool in accordance with an exemplary embodiment of the present invention. FIG. 6B is a view taken along line 6B-6B of FIG. 6A. As shown in each of FIGS. 6A-6B, support structure 610 supports workpiece 600. Upper bonding material 656 overlies upper surface 602 of workpiece 600 and lower bonding material 676 contacts lower surface 604 of workpiece 600. Lower bonding tool 660 extends through one of a plurality of support structure apertures 612 (of support structure 610) to contact one of a plurality of exposed portions 614 of lower bonding material 676. Upper pressing element 616 is positioned over lower bonding tool 660 to oppose and support (as at downward force arrow 618) lower bonding tool 660 during formation of a lower bond of exposed portion 614 of lower bonding material 676 to workpiece 600. Upper pressing element 616 may be supported by (or integrated into) various structures not shown, for example, an upper bond head assembly, a workholder of the bonding system (e.g., as in FIG. 5), a separate structure of the bonding system (e.g., such that the upper pressing element(s) aligns with, and follows, the lower bonding tool from bond location to bond location), amongst others. While a single upper pressing element 616 is shown in FIGS. 6A-6B, it is understood that a plurality of upper pressing elements (which may be actuated individually or together, and which may be carried individually or carried by a common support structure) may be provided for bonding of a given workpiece.

While not shown in FIG. 6A for simplicity, FIG. 6B illustrates lower bonding tool pressing member 678 proximate the tip of lower bonding tool 660, within aperture 612 and contacting lower bonding material 676 at/proximate the lower bond site. Lower bonding tool pressing member 678 may be supported by the lower bond head assembly (not shown) and may be moveable with respect to the lower bond head assembly independent of lower bonding tool 660. Lower bonding tool pressing member 678 presses against material 676 proximate bonding tool 660 during removal of bonding tool 660 from material 676 (e.g., after or towards the end of a bonding operation), thereby reducing the potential for bonding tool 660 to peel away or otherwise damage bonding material 676 and/or a portion of workpiece 600 after bonding, because of tool 660 sticking to bonding material 676. It is noted that while lower bonding tool 660 is shown forming a lower bond with opposing/supporting upper pressing element 616 in FIGS. 6A-6B, an analogous upper bonding tool may form an upper bond with an analogous opposing/supporting lower pressing element within the teachings of the present invention.

Figure 7A:
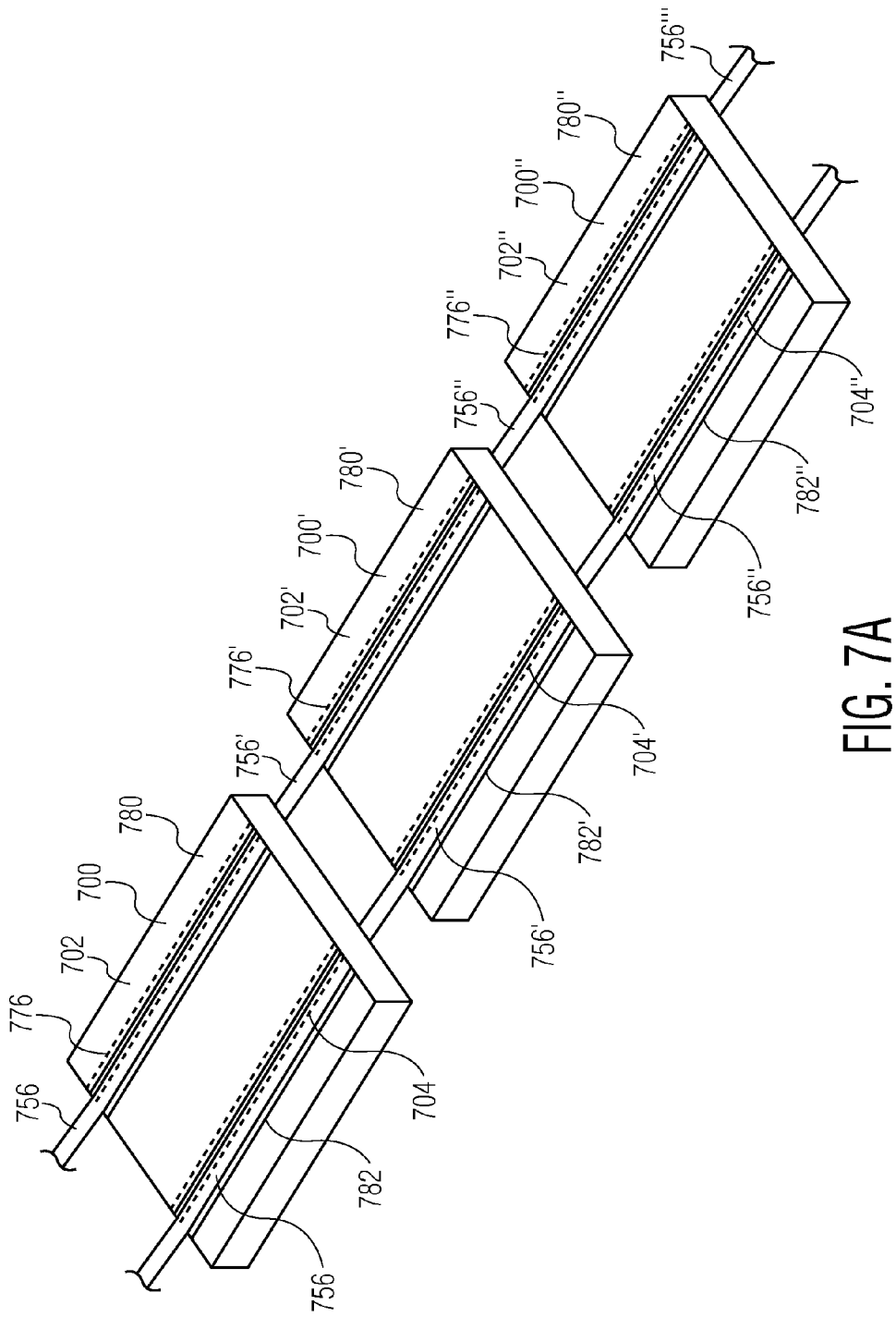
FIGS. 7A-7B are respective perspective block diagram view of a series of three electrically interconnected solar substrates, and a simplified side view thereof, according to an exemplary embodiment of the present invention.
Figure 7B:
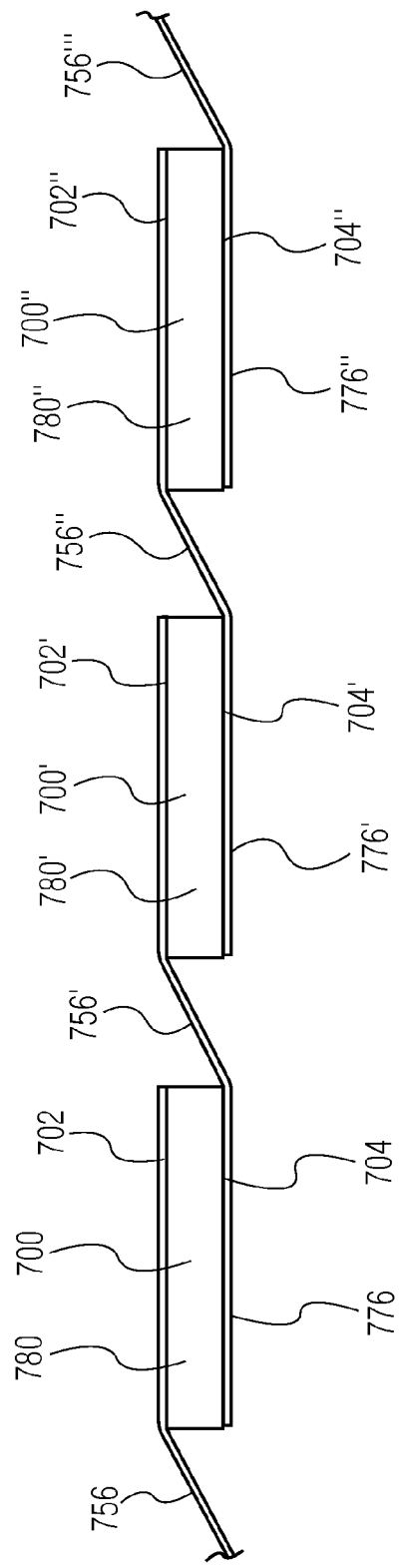

Solar substrates (e.g., solar cells) sometimes utilize electrical connections on an upper side and a lower side of each substrate. Such connections may include (1) connections between adjacent solar substrates, and (2) connections between a solar substrate(s) and an external circuit such as a collection circuit. FIGS. 7A-7B are perspective and side block diagram views of three ribbon bonded solar substrates in accordance with an exemplary embodiment of the present invention.

FIGS. 7A-7B illustrate a series of three electrically interconnected and bonded solar substrates according to an exemplary embodiment of the present invention. FIG. 7A illustrates bonded solar substrates 780, 780', 780" each comprising respective: (1) solar substrate workpieces 700, 700', 700"; (2) upper conductive ribbons 756, 756', 756" bonded on respective upper busbars 782, 782', 782" on upper surfaces 702, 702', 702" of respective workpieces 700, 700', 700"; and (3) lower conductive ribbons 776, 776', 776" bonded to lower surfaces 704, 704', 704" of workpieces 700, 700' 700" (where lower conductive ribbons 776, 776', 776" are continuations of corresponding bonded upper conductive ribbons 756', 756", 756"'). As more clearly illustrated in FIG. 7B (with the same numbering of elements except as specified), an upper conductive ribbon (756') of a bonded solar substrate (780') extends from one end of the solar substrate (780') to its other end and then continues to the lower side (704) of an adjacent bonded solar substrate (780) to become that adjacent solar substrate's (780) lower conductive ribbon (776). It is noted that several solar substrates may be electrically interconnected as illustrated, with each end substrate being configured for electrical interconnection to other elements as desired in the chosen application.

It is noted that in the exemplary embodiments of the present invention disclosed herein, and in accordance with the teachings of the present invention, bonds may be formed on the first (upper) and second (lower) sides of a workpiece without flipping the workpiece. During one or more exemplary bonding operations disclosed herein, a first (upper) bonding operation to bond a first (upper) bonding material to a first (upper) side of a workpiece may be conducted at the same time as a second (lower) bonding operation to bond a second (lower) bonding material to a second (lower) side of a workpiece. Further, an upper bonding process may be completed before a lower bonding process begins, and vice-versa. The same bonding tool/bond head assembly/bonding system may be used to form the bonds on the upper surface of a workpiece as well as the lower side of the workpiece, and vice-versa. A first bond formation on the first side may occur: a) at the same time as a second bond is formed on the second side; b) at least partially concurrently with formation of a second bond on the second side; or c) sequentially with formation of a second bond on the second side. Further, the first bond formation may occur: a) oppositely the second bond formation (i.e., the upper and lower bonding tools are positioned on opposite sides of the substrate opposing each other such as in FIGS. 2B-2E); or b) offset from the second bond formation (i.e., such as in FIG. 2A).

Certain of the exemplary embodiments of the present invention disclosed herein include multiple bonding tools for bonding on a side of a workpiece (e.g., an upper side, a lower side), where each of the bonding tools includes a respective ultrasonic transducer. However, the present invention is not limited to such an arrangement. For example, a single transducer may carry (and/or excite) a number of bonding tools. In such an arrangement, the multiple bonding tools may bond the bonding material to the respective bonding locations simultaneously if desired through the actuation of the single transducer. As a specific example, if the workpiece includes two busbars on the upper surface of the workpiece (as in FIGS. 4A-4G), then a single transducer may carry two bonding tools that are spaced to match the spacing of the two busbars. Of course, more than two bonding tools may be carried by the transducer. Further, such an arrangement (a single transducer carrying multiple bonding tools) may be utilized on the upper side of the workpiece and/or the lower side of the workpiece. Of course, transducer design issues (e.g., locations of nodes, anti-nodes, direction of scrub, etc) may be considered in the actual design of a transducer carrying multiple bonding tools, as will be appreciated by one skilled in the art.

Further, a hybrid bond tool may be utilized which includes a plurality of bonding contacts (e.g., where the bonding contacts are portions of the bonding tool that contact the bonding material during bonding). Such bonding contacts may be used to form bonds at different locations simultaneously, or separately, as desired. The different locations may be a plurality of bonding locations on one side of a workpiece, or a plurality of bonding locations including at least one location on each of multiple sides (e.g., an upper and lower side) of the workpiece.

As provided above, the present invention contemplates embodiments where one transducer (engaged with one bonding tool) is used to form bonds at a plurality of locations simultaneously using multiple bonding tools. The plurality of locations may include a plurality of locations on one side of the workpiece, or a location(s) on multiple sides (e.g., both an upper side and a lower side) of a workpiece, etc. For example, a bonding tool (engaged with an ultrasonic transducer) which contacts a bonding material on one side of a workpiece (e.g., an upper side) may excite the bonding system such that a second bonding tool (e.g., which contacts the bonding material at a different location on the same side of the workpiece, or on the opposite side of the workpiece such as the lower side) forms a bond between the bonding material and a bonding location without the second bonding tool being engaged in an ultrasonic transducer. Of course, more than two (i.e., multiple) bonding tools could be utilized in such a system where the excitation generated by a single transducer is used to form bonds using the multiple bonding tools. Furthermore, the process may be optimized such as by controlling the length of the bonding tools in order to obtain the desired vibration/scrubbing (e.g., vibration by different bonding tools in or out of phase with one another). Further still, one or more of the bonding tools may be non-conventional bonding tools. In one specific example, a portion of a workpiece support structure in contact with a bonding material may be used to form a bond in a system excited by a distinct ultrasonic transducer.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. A method of bonding a workpiece, the method comprising the steps of:
   a) supporting a workpiece with a support structure during a wire bonding operation;
   b) ultrasonically bonding an upper bonding material to an upper side of the workpiece using an upper wire bonding tool positioned above the workpiece; and
   c) ultrasonically bonding a lower bonding material to a lower side of the workpiece using a lower wire bonding tool positioned below the workpiece.

2. The method of claim 1, wherein:
step b) includes ultrasonically bonding a first conductive wire to the upper side of the workpiece using the upper wire bonding tool, the upper wire bonding tool being an upper ball bonding tool; and
step c) includes ultrasonically bonding a second conductive wire to the lower side of the workpiece using the lower wire bonding tool, the lower wire bonding tool being a lower ball bonding tool.

3. The method of claim 1, wherein:
step b) includes ultrasonically bonding a first conductive wire to the upper side of the workpiece using the upper wire bonding tool, the upper wire bonding tool being an upper wedge wire bonding tool; and
step c) includes ultrasonically bonding a second conductive wire to the lower side of the workpiece using the lower wire bonding tool, the lower wire bonding tool being a lower wedge wire bonding tool.

4. The method of claim 1, wherein:
step b) includes ultrasonically bonding a first conductive ribbon to the upper side of the workpiece using the upper wire bonding tool, the upper wire bonding tool being an upper ribbon bonding tool; and
step c) includes ultrasonically bonding a second conductive ribbon to the lower side of the workpiece using the lower wire bonding tool, the lower wire bonding tool being a lower ribbon bonding tool.

5. The method of claim 1, further comprising the step of:
d) forming a bond at a lower bond location on the lower side of the workpiece using the lower wire bonding tool while supporting the upper side of the workpiece with an upper workpiece pressing member opposite the lower bond location.

6. The method of claim 1, further comprising the step of:
d) forming a bond at an upper bond location on the upper side of the workpiece using the upper wire bonding tool while supporting the lower side of the workpiece with a lower workpiece pressing member opposite the upper bond location.

7. The method of claim 1, wherein step a) includes supporting a solar substrate with the support structure.

8. The method of claim 1, wherein the upper wire bonding tool is configured to move in one of, but not both of, an X-axis direction and a Y-axis direction.

9. The method of claim 1, wherein, during step b) a lower side of the workpiece substantially opposite the upper wire bonding tool is supported with the lower wire bonding tool during the wire bonding operation.

10. The method of claim 1, wherein the upper wire bonding tool and the lower wire bonding tool form respective bonds one after the other during the wire bonding operation.

11. The method of claim 1, wherein the upper wire bonding tool and the lower wire bonding tool form respective bonds substantially simultaneously during the wire bonding operation.

12. The method of claim 11, wherein the upper wire bonding tool and the lower wire bonding tool vibrate in-phase with one another during the wire bonding operation.

13. The method of claim 11, wherein the upper wire bonding tool and the lower wire bonding tool vibrate out-of-phase with one another during the wire bonding operation.

14. The method of claim 11, wherein the upper wire bonding tool and the lower wire bonding tool move in substantially opposite directions to one another during the wire bonding operation.

15. The method of claim 1, wherein during step c) an upper side of the workpiece substantially opposite the lower wire bonding tool is supported with the upper wire bonding tool.

16. The method of claim 1, wherein step a) includes supporting the workpiece with the support structure such that the support structure includes a plurality of lower pressing elements separated by a plurality of lower apertures exposing lower portions of the workpiece.

17. The method of claim 1, further comprising the step of overlying at least a portion of the upper side of the workpiece with an upper pressing member during the wire bonding operation.

18. The method of claim 17, wherein the step of overlying at least a portion of the upper side of the workpiece includes overlying at least a portion of the upper side of the workpiece with an upper pressing member including a plurality of upper pressing elements separated by a plurality of upper apertures exposing upper portions of the workpiece.

19. The method of claim 17, wherein:
step a) includes supporting the workpiece with the support structure such that the support structure includes a plurality of lower pressing elements separated by a plurality of lower apertures exposing lower portions of the workpiece; and
the step of overlying at least a portion of the upper side of the workpiece includes overlying at least a portion of the upper side of the workpiece with an upper pressing member including a plurality of upper pressing elements separated by a plurality of upper apertures exposing upper portions of the workpiece.

20. The method of claim 19, wherein the plurality of lower apertures oppose the plurality of upper pressing elements, and the plurality of upper apertures oppose the plurality of lower pressing elements.

21. The method of claim 20, including the step of extending the upper wire bonding tool into at least one of the plurality of upper apertures and ultrasonically bonding the upper bonding material to the upper side of the workpiece.

22. The method of claim 20, including the step of extending the lower wire bonding tool into at least one of the plurality of lower apertures and ultrasonically bonding the lower bonding material to the lower side of the workpiece.

23. The method of claim 1, wherein either:
step b) includes ultrasonically bonding the upper bonding material to the upper side of the workpiece using at least two of the upper wire bonding tools each positioned above the workpiece; or
step c) includes ultrasonically bonding the lower bonding material to the lower side of the workpiece using at least two of the lower wire bonding tools each positioned below the workpiece.

24. The method of claim 1, wherein step b) includes ultrasonically bonding the upper bonding material to the upper side of the workpiece using at least two of the upper wire bonding tools coupled for movement together in at least one direction.

25. The method of claim 1, wherein step c) includes ultrasonically bonding the lower bonding material to the lower side of the workpiece using at least two of the lower wire bonding tools coupled for movement together in at least one direction.

26. An ultrasonic ribbon bonding machine comprising:
a) a solar substrate support structure configured to support a solar substrate during a ribbon bonding operation;
b) an ultrasonic upper ribbon bonding tool positioned above the solar substrate support structure and configured for bonding a first conductive ribbon to an upper side of the solar substrate; and c) an ultrasonic lower ribbon bonding tool positioned below the solar substrate support structure and configured for bonding a second conductive ribbon to a lower side of the solar substrate.

27. The ultrasonic ribbon bonding machine of claim 26, wherein the solar substrate comprises a solar cell.

28. The ultrasonic ribbon bonding machine of claim 26, wherein the ultrasonic upper ribbon bonding tool moves in one of, but not both of, an X-axis direction and a Y-axis direction.

29. The ultrasonic ribbon bonding machine of claim 26, wherein during the ribbon bonding operation using the ultrasonic upper ribbon bonding tool, the ultrasonic lower ribbon bonding tool supports a lower side of the solar substrate substantially opposite the ultrasonic upper ribbon bonding tool.

30. The ultrasonic ribbon bonding machine of claim 26, wherein the ultrasonic upper and ultrasonic lower ribbon bonding tools are configured to form respective bonds one after the other during the ribbon bonding operation.

31. The ultrasonic ribbon bonding machine of claim 26, wherein during the ribbon bonding operation using the ultrasonic lower ribbon bonding tool, the ultrasonic upper ribbon bonding tool supports an upper side of the solar substrate substantially opposite the ultrasonic lower ribbon bonding tool.

32. The ultrasonic ribbon bonding machine of claim 26, wherein the ultrasonic upper and ultrasonic lower ribbon bonding tools are configured to form respective bonds one after the other during the ribbon bonding operation.

33. The ultrasonic ribbon bonding machine of claim 26, wherein the ultrasonic upper and ultrasonic lower ribbon bonding tools are configured to form respective bonds substantially simultaneously during the ribbon bonding operation.

34. The ultrasonic ribbon bonding machine of claim 33, wherein the ultrasonic upper ribbon bonding tool and the ultrasonic lower ribbon bonding tool are configured to vibrate in-phase with one another.

35. The ultrasonic ribbon bonding machine of claim 33, wherein the ultrasonic upper ribbon bonding tool and the ultrasonic lower ribbon bonding tool are configured to vibrate out-of-phase with one another.

36. The ultrasonic bonding machine of claim 33, wherein the ultrasonic upper ribbon bonding tool and the ultrasonic lower ribbon bonding tool are configured to move in substantially opposite directions to one another during the ribbon bonding operation.

37. The ultrasonic ribbon bonding machine of claim 26, further comprising an upper pressing member configured to overlie at least a portion of the upper side of the solar substrate during the ribbon bonding operation.

38. The ultrasonic ribbon bonding machine of claim 37, wherein the solar substrate support structure includes a plurality of lower pressing elements separated by a plurality of lower apertures exposing lower portions of the solar substrate.

39. The ultrasonic ribbon bonding machine of claim 37, wherein the upper pressing member includes a plurality of upper pressing elements separated by a plurality of upper apertures exposing upper portions of the solar substrate.

40. The ultrasonic ribbon bonding machine of claim 37, wherein the solar substrate support structure includes a plurality of lower pressing elements separated by a plurality of lower apertures, and the upper pressing member includes a plurality of upper pressing elements separated by a plurality of upper apertures.

41. The ultrasonic ribbon bonding machine of claim 40, wherein the plurality of lower apertures oppose the plurality of upper pressing elements, and the plurality of upper apertures oppose the plurality of lower pressing elements.

42. The ultrasonic ribbon bonding machine of claim 41, wherein the ultrasonic upper ribbon bonding tool extends into at least one of the plurality of upper apertures to bond the first conductive ribbon to the upper side of the solar substrate.

43. The ultrasonic ribbon bonding machine of claim 41, wherein the ultrasonic lower ribbon bonding tool extends into at least one of the plurality of lower apertures to bond the second conductive ribbon to the lower side of the solar substrate.

44. The ultrasonic ribbon bonding machine of claim 26, comprising at least two of the ultrasonic upper ribbon bonding tools, or at least two of the ultrasonic lower ribbon bonding tools.

45. The ultrasonic ribbon bonding machine of claim 26, further comprising at least one additional ultrasonic upper ribbon bonding tool, wherein the ultrasonic upper ribbon bonding tool and the at least one additional ultrasonic upper ribbon bonding tool are coupled for movement together in at least one direction.

46. The ultrasonic ribbon bonding machine of claim 26, further comprising at least one additional ultrasonic lower ribbon bonding tool, wherein the ultrasonic lower ribbon bonding tool and the at least one additional ultrasonic lower ribbon bonding tool are coupled for movement together in at least one direction.

47. A method of bonding a solar substrate, the method comprising the steps of:

a) supporting a solar substrate with a solar substrate support structure during a ribbon bonding operation;

b) ultrasonically bonding a first conductive ribbon to an upper side of the solar substrate using an upper ribbon bonding tool positioned above the solar substrate; and c) ultrasonically bonding a second conductive ribbon to a lower side of the solar substrate using a lower ribbon bonding tool positioned below the solar substrate.

48. The method of claim 47, further comprising the step of:

d) forming a bond at a lower bond location on the lower side of the solar substrate using the lower ribbon bonding tool while supporting the upper side of the solar substrate with an upper solar substrate pressing member opposite the lower bond location.

49. The method of claim 47, further comprising the step of:

d) forming a bond at an upper bond location on the upper side of the solar substrate using the upper ribbon bonding tool while supporting the lower side of the solar substrate with a lower solar substrate pressing member opposite the upper bond location.

50. The method of claim 47, wherein step a) includes supporting a solar cell with the solar substrate support structure.

51. The method of claim 47, wherein the upper ribbon bonding tool is configured to move in one of, but not both of, an X-axis direction or a Y-axis direction.

52. The method of claim 47, wherein during step b) a lower side of the solar substrate substantially opposite the upper ribbon bonding tool is supported with the lower ribbon bonding tool.

53. The method of claim 47, wherein the upper ribbon bonding tool and the lower ribbon bonding tool form respective bonds one after the other during the ribbon bonding operation.

54. The method of claim 47, wherein the upper ribbon bonding tool and the lower ribbon bonding tool form respective bonds substantially simultaneously during the ribbon bonding operation.

55. The method of claim 54, wherein the upper ribbon bonding tool and the lower ribbon bonding tool vibrate in-phase with one another.

56. The method of claim 54, wherein the upper ribbon bonding tool and the lower ribbon bonding tool vibrate out-of-phase with one another.

57. The method of claim 54, wherein the upper ribbon bonding tool and the lower ribbon bonding tool move in substantially opposite directions to one another.

58. The method of claim 47, wherein during step c) an upper side of the solar substrate substantially opposite the lower ribbon bonding tool is supported with the upper ribbon bonding tool.

59. The method of claim 47, wherein step a) includes supporting the solar substrate with the solar substrate support structure such that the solar substrate support structure includes a plurality of lower pressing elements separated by a plurality of lower apertures exposing lower portions of the solar substrate.

60. The method of claim 47, further comprising the step of overlying at least a portion of the upper side of the solar substrate with an upper pressing member during the ribbon bonding operation.

61. The method of claim 60, wherein the step of overlying at least a portion of the upper side of the solar substrate includes overlying at least a portion of the upper side of the solar substrate with the upper pressing member including a plurality of upper pressing elements separated by a plurality of upper apertures exposing upper portions of the solar substrate.

62. The method of claim 60, wherein:
step a) includes supporting the solar substrate with the solar substrate support structure such that the solar substrate support structure includes a plurality of lower pressing elements separated by a plurality of lower apertures; and
the step of overlying at least a portion of the upper side of the solar substrate includes overlying at least a portion of the upper side of the solar substrate with the upper pressing member including a plurality of upper pressing elements separated by a plurality of upper apertures.

63. The method of claim 62, wherein the plurality of lower apertures oppose the plurality of upper pressing elements, and the plurality of upper apertures oppose the plurality of lower pressing elements.

64. The method of claim 63, including the step of extending the upper ribbon bonding tool into at least one of the plurality of upper apertures and ultrasonically bonding the first conductive ribbon to the upper side of the solar substrate.

65. The method of claim 63, including the step of extending the lower ribbon bonding tool into at least one of the plurality of lower apertures and ultrasonically bonding the second conductive ribbon to the lower side of the solar substrate.

66. The method of claim 47, wherein at least one of:
step b) includes ultrasonically bonding the first conductive ribbon to the upper side of the solar substrate using at least two of the upper ribbon bonding tools each positioned above the solar substrate; or
step c) includes ultrasonically bonding the second conductive ribbon to the lower side of the solar substrate using at least two of the lower ribbon bonding tools each positioned below the solar substrate.

67. The method of claim 47, wherein step b) includes ultrasonically bonding the first conductive ribbon to the upper side of the solar substrate using at least two of the upper ribbon bonding tools coupled for movement together in at least one direction during the ribbon bonding operation.

68. The method of claim 47, wherein step c) includes ultrasonically bonding the second conductive ribbon to the lower side of the solar substrate using at least two of the lower ribbon bonding tools coupled for movement together in at least one direction during the ribbon bonding operation.

\* \* \* \* \*